United States Patent [19]
Matsumoto et al.

[11] Patent Number: 5,598,372
[45] Date of Patent: Jan. 28, 1997

[54] SEMICONDUCTOR MEMORY

[75] Inventors: Miki Matsumoto, Ohme; Kanji Oishi, Koganei; Masahiro Katayama, Ohme; Kazufumi Watanabe, Hachioji, all of Japan

[73] Assignees: Hitachi, Ltd.; Hitachi ULSI Engineering Corp., both of Tokyo, Japan

[21] Appl. No.: 507,604

[22] Filed: Jul. 25, 1995

[30] Foreign Application Priority Data

Jul. 27, 1994 [JP] Japan .................................. 6-194893

[51] Int. Cl.⁶ .................................................. G11C 13/00
[52] U.S. Cl. ............................... 365/230.01; 365/189.04; 365/230.03; 365/222
[58] Field of Search ............................... 365/185, 189.01, 365/189.02, 189.04, 230.01, 230.03, 222, 230.04, 230.06

[56] References Cited

U.S. PATENT DOCUMENTS 4,766,570  8/1988  Yamaguchi et al. .
4,903,236  2/1990  Nakayama et al. ................... 365/185

*Primary Examiner*—Terrell W. Fears
*Attorney, Agent, or Firm*—Antonelli, Terry, Stout & Kraus, LLP

[57] ABSTRACT

A semiconductor memory incorporating an operation circuit for carrying out logical operations on data and arithmetic operations on address signals. The memory is arranged functionally so that the data representing the result of each of such operations is written to a memory array while also being output through an external terminal in the same memory cycle.

12 Claims, 11 Drawing Sheets

EXAMPLE OF PICTURE LAYOUT FOR SDRAM

SEMICONDUCTOR MEMORY

BACKGROUND OF THE INVENTION

The present invention relates to a semiconductor memory comprising techniques that may be adapted advantageously to an image memory incorporating an operation circuit.

In the related art, U.S. Pat. No. 4,766,570 issued on Aug. 23, 1988 discloses an image processing memory that incorporates an operation function and a serial output function.

SUMMARY OF THE INVENTION

Conventional semiconductor memories having the operation function store the results of operations therein. Conventional semiconductor memories with the serial output function may read operation results from inside in synchronism with a predetermined timing such as the raster timing for display on an external display unit. In other words, such semiconductor memories are not constituted to output their operation results directly to the outside. Meanwhile, to send the results of operations to an external host computer for data processing requires redesignating the data in memory and retrieving it therefrom for transfer to the outside. The exercise tends to lower data processing performance. For example, the inventors of this invention found that it takes two cycles illustratively to complete one exclusive-OR operation in detecting the movement of image data.

It is therefore an object of the present invention to provide a semiconductor memory for carrying out diverse kinds of data processing at high speed.

This and other objects, features and advantages of the invention will become more apparent upon a reading of the following description and appended drawings.

To achieve the above and other objects in accordance with the invention as broadly described herein, there is provided a semiconductor memory comprising an operation circuit, a memory array and an external terminal. The operation circuit performs logical operations on data or performs arithmetic operations on address signals. The data representing the result of each of such operations is written to the memory array while also being output through the external terminal in the same memory cycle.

When embodied as outlined, the inventive semiconductor memory carries out diverse kinds of data processing at high speed. This is because the data reflecting the result of any operation executed in a single memory cycle is also input or output in the same memory cycle.

DESCRIPTION OF THE PREFERRED EMBODIMENTS

Figure 1:
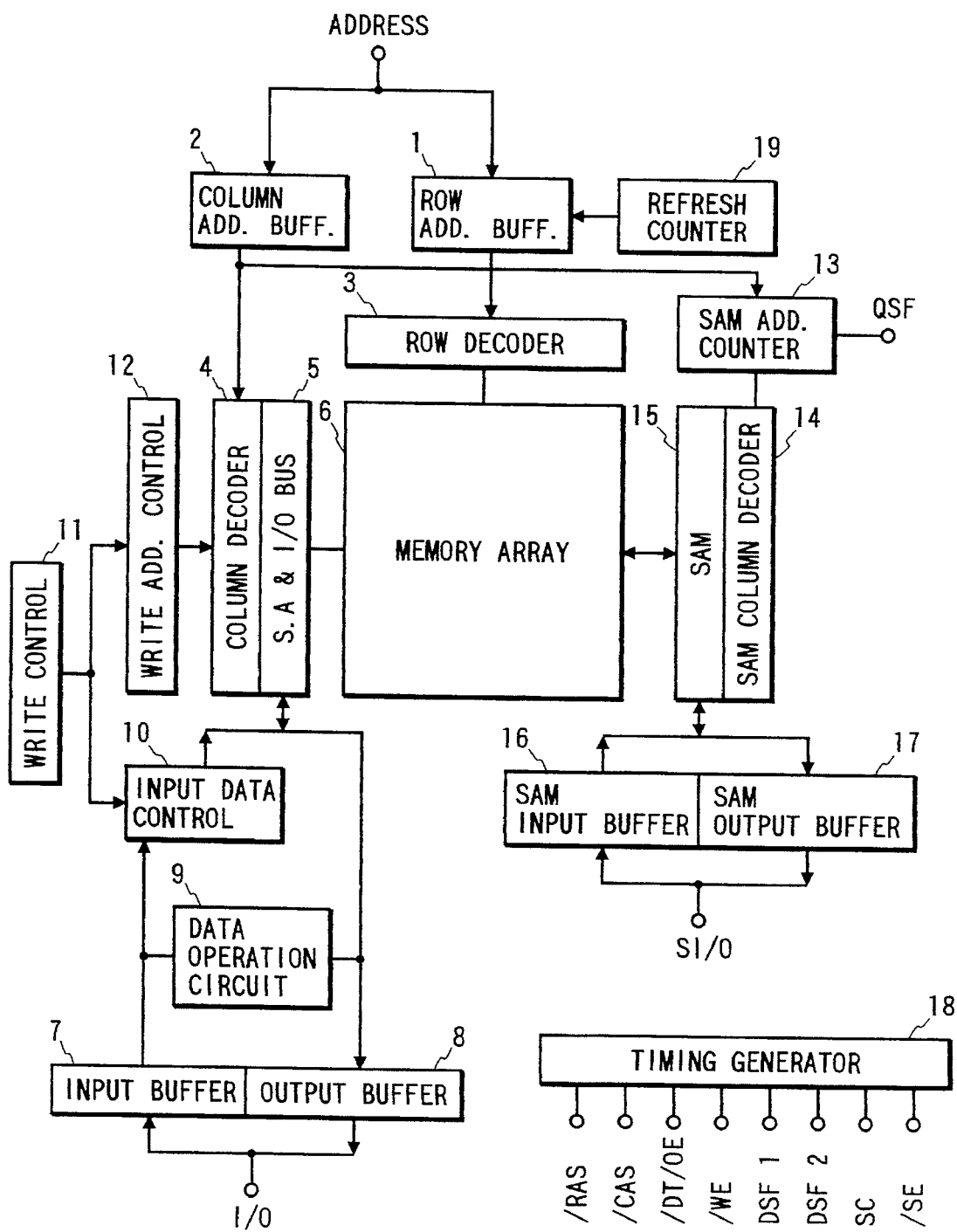
FIG. 1 is a block diagram of a semiconductor memory practiced as a first embodiment of the invention.

FIG. 1 is a block diagram of a semiconductor memory practiced as the first embodiment of the invention. The first embodiment is typically used as an image memory having a random input/output port and a serial input/output port. The circuit blocks in FIG. 1 are fabricated in practice by known semiconductor integrated circuit fabrication techniques on a single semiconductor substrate typically made of single crystal silicon.

A row address buffer 1 receives a row (X) address signal entered from an address terminal in synchronism with a row address strobe signal /RAS. The row address buffer 1 supplies an internal address signal to a row decoder 3. Given the internal address signal, the row decoder 3 decodes it and selects one word line accordingly. The row decoder 3 includes a word driver that rapidly drives word lines having large load capacities as a result of their connection to numerous memory cells.

A column address buffer 2 receives a column (Y) address signal entered from the address terminal in synchronism with a column address strobe signal /CAS. In return, the column address buffer 2 sends an internal address signal to a random column decoder 4 and a serial address counter 13. The random column decoder 4 in random access mode decodes the received address signal and generates a bit line selection signal accordingly. The serial address counter 13 in serial access mode receives the address signal as its initial value.

In a memory array 6, dynamic memory cells made of address selection MOSFETs and data storage capacitors are located in a matrix fashion at the points of intersection between word lines and bit lines (or between data lines and digit lines). The bit lines are arranged in what is known as the folded bit line arrangement wherein each pair of complementary bit lines are extended in parallel with a sense amplifier SA. In FIG. 1, the bit lines and word lines are extended crosswise and lengthwise, respectively, in the memory array 6.

The circuit block 5 comprises sense amplifiers SA and input/output lines (I/O bus). The sense amplifiers SA and the input/output lines 5 correspond to the bit lines of the memory array 6. A sense amplifier SA amplifies a very small signal level difference read out on a pair of complementary bit lines, whereby the potentials of the complementary bit lines are amplified up to the high level corresponding with the supply voltage and to the low level representing the grounding potential of the circuit. This makes it possible both to amplify the read-out signal and to restore the dissipating data charge in the data storage capacitor constituting the memory cell, the dissipation being caused by the read operation. The input/output lines (I/O bus) include column switch MOSFETs for connecting the bit lines to these I/O lines. The selection signal generated by the column decoder 4 is fed to the gate of the corresponding column switch MOSFET.

The input/output lines (I/O bus) 5 are also connected to output buffers 8 constituting part of the random input/output port. In the first embodiment, the input/output lines 5 input and output data in units of four bits, which however are not limitative of the invention. The four-bit random data is output from a terminal I/O through the output buffers 8.

A pixel data operation circuit 9 is provided to deal with random data input. This operation circuit carries out such logical operations as AND, OR and exclusive-OR on image data. The result of the operation performed by the operation circuit 9 in one memory cycle is written in the same memory cycle to the memory array 6 via a column selection circuit for the random input/output port. The same data is also output through the output buffers 8.

An input data control circuit 10 has mask registers that mask any of the bits constituting the four-bit unit data. That is, specific bits of the input data received from the external terminal I/O are masked and prevented from getting written, whereby the initial bits corresponding to the masked bits are preserved. This arrangement allows only desired bits of the four bits to be updated.

A write control circuit 11 controls the input data control circuit 10 as well as a write address control circuit 12 to be described below. The write control circuit 11 provides such settings as data masks to the input data control circuit 10. The write address control circuit 12 effects masks on a block write operation (to be described later) addressing a plurality of data units or on a flash write operation in units of word lines. The block write operation involves writing a plurality of data units as one block of the same data. The flash write operation involves writing the same data in units of word lines. These write operations are accomplished specifically by ordering the column decoder 4 to select column switches representing a block or a group of word lines. Where the block write and flash write functions are furnished, the serial input function, to be described below, of the serial input/output port may be omitted.

A serial memory (SAM) 15 is composed of a static RAM including a transfer gate for parallelly transferring bit line data of the memory array 6. The serial memory may be divided into, but not limited by, two portions for which two data transfer circuits may be provided. In that case, one data transfer circuit carries out serial data input/out while the other circuit performs data transfer to and from the memory array 6.

A serial selection circuit (SAM column decoder) 14 decodes the address signal from the address counter 13 and generates a selection signal accordingly. The selection signal is fed to the gate of the selection switch MOSFET of the serial memory 15. The data thus retrieved is output from an output terminal SI/O via the serial output lines and a serial output circuit (SAM output buffer) 17. Otherwise, serial data entered through a serial input circuit (SAM input buffer) 16 is transferred to the serial memory 15.

It should be understood that there are provided four memory arrays 6 and four data I/O routes corresponding thereto in order to carry out random or serial data input/output in units of four bits. The address selecting peripheral circuits are common to the four circuits which are accessed simultaneously thereby.

A timing generator 18 receives externally supplied signals /RAS, /CAS, /DT/OE, /WE, DSF1, DSF2, SC and /SE, and generates various control signals and timing signals necessary for internal circuit operations. The slash (/) attached to the signal names such as /RAS, /CAS and /WE indicates that the signal in question is active when driven Low. The symbol is thus equivalent to a bar drawn usually over the characters representing a signal.

Of the above signals, the signals /RAS and /CAS are strobe signals that are used to receive the address signal as described above. The signal /WE is an write enable signal. In random access mode, the signal /WE enables a read operation when driven High and a write operation when brought Low. The signal /DT/OE designates one of two functions, parallel transfer timing control and output enable control, for setting the operation timing of the transfer gate depending on the operation mode in effect.

The signal SC is a serial clock signal. The address counter 13 counts the signal SC in generating a serial address signal. That is, data is output from the serial output terminal SI/O in synchronism with the serial clock signal SC. The signal /SE is a serial enable signal. Bringing the signal /SE Low activates the circuits related to the serial output operation, thereby effecting the serial data output outlined above.

A control clock generator receives an output enable signal OE, a row address strobe signal RAS, a column address strobe signal CAS and a write enable signal WE. In return, the control clock generator judges the internal operation mode and generates clock pulses accordingly. The control clock generator also supplies a shift register with clock pulses for serial data transfer via the serial input/output port.

A refresh counter 19 is activated by bringing the signal /CAS Low when the signal /RAS is at the high level. The refresh counter 19 carries out its counting operation using the level changes in the signal /RAS as a clock signal, generating a row address signal required for a refresh operation. The refresh address signal is fed to the row decoder 3 through the row address buffer 1. The refresh operation triggered by the refresh address signal involves selecting the word lines, having the sense amplifiers SA read and amplify data from the relevant memory cells, and rewriting the data back to the memory cells.

The mode in which to activate the operation circuit 9 is designated by signals DSF1 and DSF2. The type of the operation to be carried out is determined by an appropriate combination of the control signals /RAS, /CAS, /DT/OE, /WE, SC and /SE. For example, when the signal /RAS is High and the signal /WE Low, the operation mode is established. Then the signals DSF1 and DSF2 may be suitably combined to designate the execution of such logical operations as AND, OR, and exclusive-OR. Other control signals may also be combined. Alternatively, the type of operation may be designated by combining the signal DSF1 with the address signal or with data.

Figure 2:
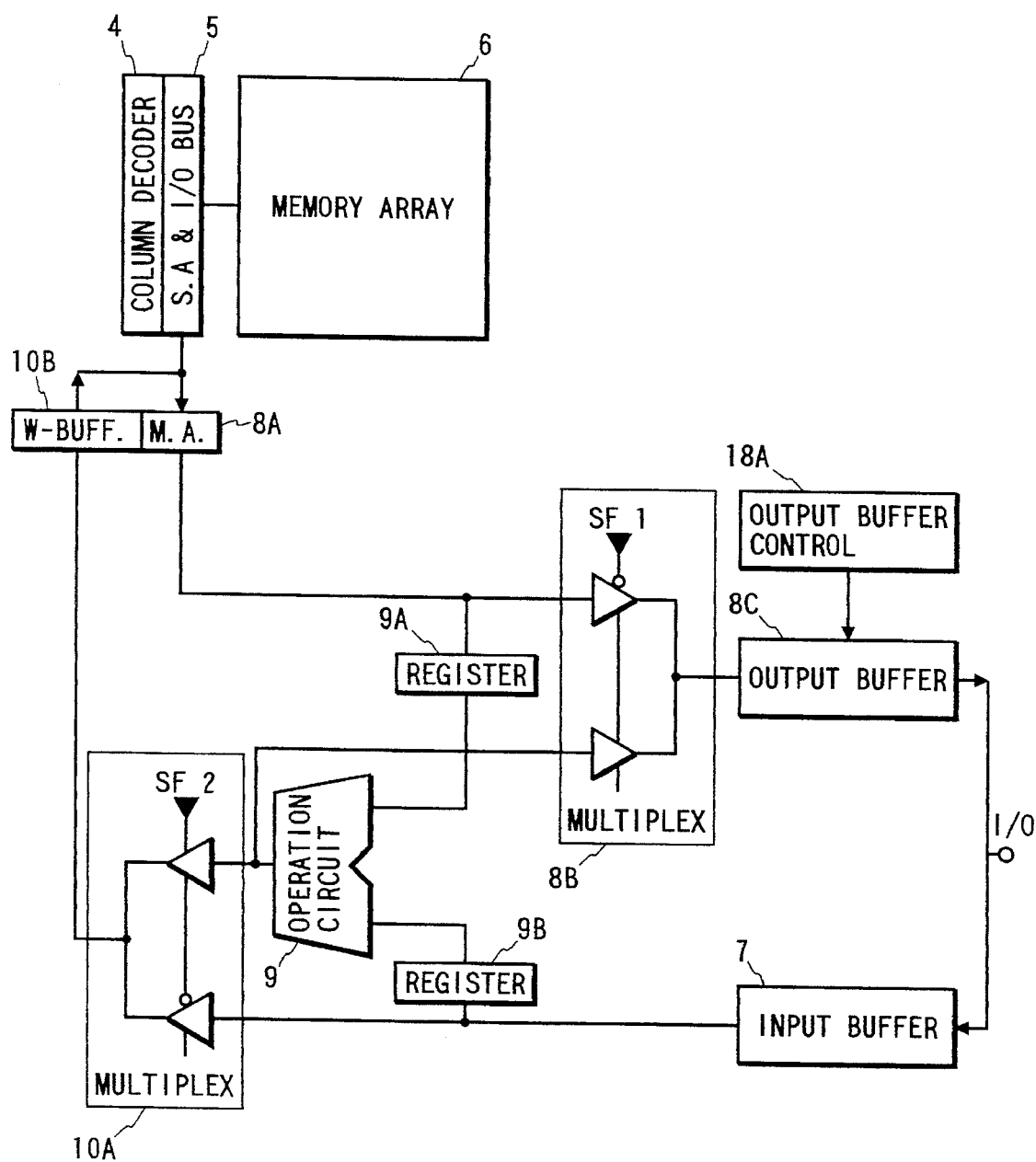
FIG. 2 is a schematic block diagram of the operation circuit and the parts associated therewith in the RAM of the first embodiment.

FIG. 2 is a schematic block diagram of the operation circuit and the parts associated therewith in the RAM of the first embodiment or in a RAM with no serial port furnished thereto. The two inputs of the operation circuit 9 are provided with registers 9A and 9B. The register 9B retains input data from an input buffer 7. A multiplexer 10A is provided to receive selectively the input data entered through the input buffer 7 or the result of the operation from the operation circuit 9. The output signal from the multiplexer 10A is sent through a write buffer 10B to the input/output lines 5. The multiplexer 10A and write buffer 10B are included in the input data control circuit 10 of FIG. 1.

A signal read through the input/output lines 5 is amplified by a main amplifier (MA) 8A. An amplified output signal from the main amplifier 8A is retained by the register 9A. A multiplexer 8B is provided to output selectively the output signal from the main amplifier 8A or the result of the operation from the operation circuit 9. The output signal of the multiplexer 8B is output via an output circuit 8C controlled by an output buffer control circuit 18A. The output buffer control circuit 18A is included in the timing generator 18. It should be understood that the main amplifier 8A, multiplexer 8B and output circuit 8C are included in the output buffers 8 of FIG. 1.

The memory array 6, sense amplifier and input/output line block 5, and column decoder 4 in FIG. 2 are identical to those in FIG. 1 and will not be discussed further. The other circuit blocks in FIG. 1 are omitted in FIG. 2. In the setup of FIG. 2, a control signal SF1 for controlling the multiplexer 8A and a control signal SF2 for controlling the multiplexer 10A are combined so as to permit in one memory cycle the kind of memory access operation described below.

The register 9A is set to retain the data retrieved in the preceding memory cycle from the memory array 6. In write mode, data is admitted from the external terminal I/O and entered via the register 9B into the operation circuit 9 for an operation. The result of the operation may be written to the memory array 6 by a switchover of the multiplexer 10A. In parallel with this write operation, the operation data may be output from the output circuit 8C past the multiplexer 8B. If the multiplexer 10A is set to the input data side, the input data may be written to the memory array at the same time that the result of the operation is output via the multiplexer 8B. In this operation mode, the operation circuit 9 is set to perform an exclusive-OR operation, with the register 9B admitting update data. This setting allows picture data to be updated while the movement of the data is being judged for presence.

The register 9B is set to retain the data received in the preceding memory cycle from the input buffer 7. In read mode, data is read from the memory array 6 and entered via the register 9A into the operation circuit 9 for an operation. The result of the operation may be output by a switchover of the multiplexer 10A. The multiplexer 10A may be switched alternatively to let the signal read from the memory array 6 be output unchecked. Because the result of the operation in this case is nullified, the signal SF1 may be used to inhibit the operation itself of the operation circuit 9.

Figure 3:
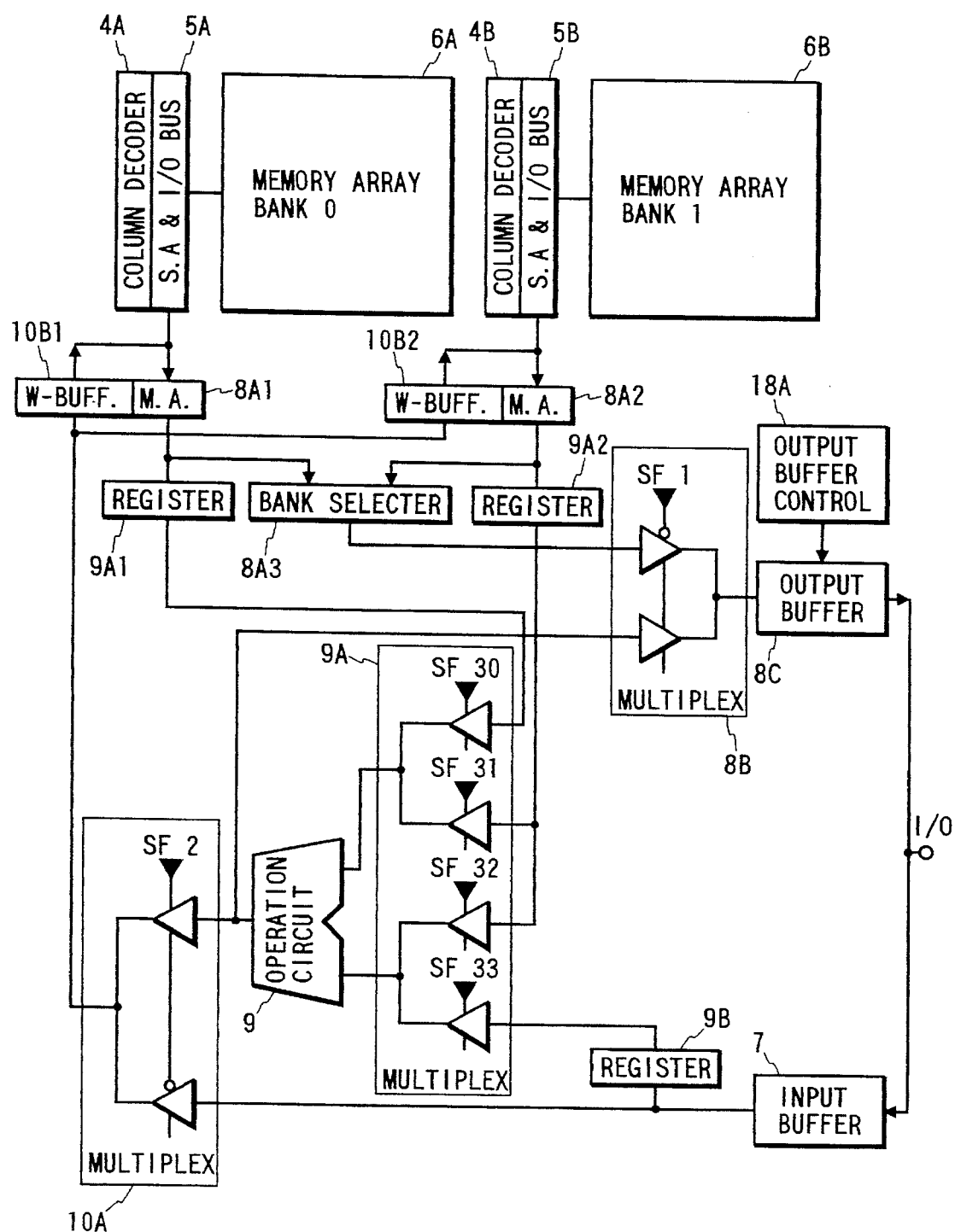
FIG. 3 is a block diagram of an SDRAM practiced as a second embodiment of the invention.

FIG. 3 is a block diagram of a synchronous dynamic RAM (simply called the SDRAM hereunder) practiced as the second embodiment of the invention. The circuit blocks in FIG. 3 are fabricated in practice by known semiconductor integrated circuit fabrication techniques on a single semiconductor substrate typically made of single crystal silicon.

The second embodiment in the form of the SDRAM comprises a memory array 6A and a memory array 6B constituting a memory bank 0 and a memory bank 1, respectively. The memory arrays 6A and 6B are each identical in constitution to the memory array of FIG. 1. Thus any one of the word lines of the memory array 6A, not shown, is driven to the selected level in accordance with the result of decoding by a row decoder, also not shown, which decodes the row address signal. The complementary data lines, not shown, of the memory array 6 are connected to a sense amplifier and input/output line block 5A. Each sense amplifier SA in the sense amplifier and input/output line block 5A is an amplifier circuit that detects and amplifies a very small signal level difference appearing on a pair of complementary data lines as a result of a data read operation from memory cells. The input/output lines (I/O bus) 5A are connected to the selected complementary data lines of the memory array 6A via a column switch similar to the one described earlier. The column switch is operated selectively in accordance with the result of decoding by the column decoder 4A that decodes the column address signal. Another row decoder, a sense amplifier and input/output line block 5B and a column decoder 4B are provided likewise on the side of the memory array 6B.

The input/output lines 5A corresponding to the memory bank 0 are connected to a write buffer 10B1 for write operations and to a main amplifier 8A1 for read operations. The input/output lines 5B corresponding to the memory bank 1 are connected to a write buffer 10B2 for write operations and to a main amplifier 8A2 for read operations. The input of the operation circuit 9 for operating on data is connected to three registers via a multiplexer 9C. As with the setup of FIG. 2, the register 9B corresponds to the input buffer 7. A register 9A1 and a register 9A2 are furnished to correspond with the memory banks 0 and 1, respectively.

The output signal of the input buffer 7 is fed both to the register 9B and to the multiplexer 10A. As with the multiplexer in FIG. 2, the multiplexer 10A selects one of two alternatives: either to write direct to the memory bank 0 or 1 the data entered through the input buffer 7, or to write to the memory the result of the operation by the operation circuit 9. The multiplexer 8B selectively supplies the output circuit 8C either with the signal read through a bank selector 8A3 or with the result of the operation by the operation circuit 9. The output circuit 8C is controlled by the output buffer control circuit 18A.

A row selection circuit and a refresh control circuit, not shown in FIG. 3, are constituted by the components similar to those in FIG. 1. For example, a row and a column address signal each made of 10 bits and supplied from address input terminals A0 through A9 are admitted respectively to the row and the column address buffer in an address multiplexing fashion. The supplied address signals are retained by their respective buffers. In refresh operation mode, the row address buffer receives as its row address the refresh address signal from the refresh counter. The output of the column address buffer is fed as preset data to the column address counter. In the operation mode designated by commands to be described later, the column address counter supplies the column decoder 4A or 4B with the column address signal in the form of the preset data or with values acquired by successively incrementing that column address signal.

A controller, not shown in FIG. 3, receives such external control signals as a clock signal CLK, clock enable signal CKE, chip select signal /CS, column address strobe signal /CAS, row address strobe signal /RAS and write enable signal /WE, as well as control data from the address input terminals A0 through A9. In accordance with the level changes and the timings of these signals, the controller generates internal timing signals for controlling the operation mode of the SDRAM and the workings of the circuit blocks. To implement such capabilities, the controller incorporates suitable control logic, not shown, and a mode register arrangement.

The clock signal CLK is used as the master clock signal of the SDRAM. The other externally entered signals are made significant in synchronism with a leading edge of the clock signal CLK. The chip select signal /CS designates the start of a command input cycle when brought Low. When driven High, the chip select signal /CS signifies the chip unselected state and nullifies the significance of the other input signals. It should be noted, however, that the selected state of the memory bank and such internal operations as a burst operation are not affected by the state of the chip being selected or unselected. The signals /RAS, /CAS and /WE differ functionally from their counterparts of the ordinary DRAM; they are made significant when defining the command cycles to be described later.

The clock enable signal CKE is a signal that designates the effectiveness of the next clock signal. That is, the signal CKE enables a leading edge of the next clock signal CLK when brought High and nullifies the clock signal when driven Low. In read mode, the controller is supplied with an external control signal for effecting output enable control over the output circuit 8C. Illustratively, driving the external control signal High places the output circuit 8C in the high output impedance state.

The row address signal is defined by the levels at the terminals A0 through A8 in a row address strobe/bank active command cycle in synchronism with a leading edge of the clock signal CLK. The command cycle will be described later.

The input from the terminal A9 is regarded as a bank selection signal in the row address strobe/bank active command cycle mentioned above. The bank selection signal selects the memory bank 0 when driven Low and chooses the memory bank 1 when brought High. Memory bank selection control is effected by, but not limited to, any one of such processes as the activation of the row decoder alone on the side of the selected memory bank, the nonselection of all column switch circuits on the side of the unselected memory bank, and the connection of the selected memory bank alone to the input and output buffers.

The input from the terminal A8 in a pre-charge command cycle, to be described later, designates how a pre-charge operation is to be performed on complementary data lines. When driven high, the input designates that the pre-charge operation is to be carried out on both memory banks; when brought Low, the input designates that the pre-charge operation is to be effected on one of the memory banks specified by the input from the terminal A9.

The column address signal is defined by the levels at the terminals A0 through A7 in a read or write command (column address read command or column address write command, to be described later) cycle in synchronism with a leading edge of the clock signal CLK. The column address thus defined serves as the start address for a burst access operation.

Described below are major commands for designating how the SDRAM is to operate in its operation mode.

(1) Mode register set command (Mo)

The mode register set command is used to set a mode register 30. This command is designated when the signals /CS, /RAS, /CAS and /WE are driven Low. The data to be set (i.e., register set data) is given through the terminals A0 through A9. The register set data pertains to the burst length, CAS latency and write mode, but is not limited thereby. The burst length to be set may be 1, 2, 4, 8, or 256 bits (full page) long; the CAS latency is 1, 2 or 3 cycles; and the write mode may be burst write or single write mode. It should be noted that these settings are for illustrative purposes only and are not limitative of the invention.

The CAS latency designates how many cycles of the clock signal CLK are to occur from the time the signal /CAS falls until the time an output buffer 211 effects its output during the read operation designated by a column address read command, to be described later. Until the target read data is established, an internal operation time is needed for the data read operation to be completed. That internal operation time is set in accordance with the frequency of the clock signal CLK. In other words, the CAS latency is set for a relatively high value where the clock signal CLK has a high frequency and for a relatively low value where the clock signal CLK has a low frequency.

(2) Low address strobe/bank active command (Ac)

The low address strobe/bank active command is used to enable the low address strobe setting and the selection of the memory bank made by the input from the terminal A9. This command is designated when the signals /CS and /RAS are driven Low and the signals /CAS and /WE are High. When designated, the command causes the address fed to the terminals A0 through A8 to be admitted as the row address signal and the signal fed to the terminal A9 to be admitted as the memory bank selection signal. The signal admission takes place in synchronism with a leading edge of the clock signal CLK. For example, when the row address strobe/bank active command is designated, the relevant word line of the memory bank specified by that command is selected. The memory cells connected to the word line in question conduct to the corresponding complementary data lines.

(3) Column address read command (Re)

The column address read command is needed to start a burst read operation, and is also used to designate a column address strobe operation. This command is designated when the signals /CS an /CAS are driven Low and the signals /RAS and /WE are High. When designated, the command causes the column address fed to the terminals A0 through A7 to be admitted as the column address signal. The column address signal thus received is supplied as a burst start address to a column address counter 207. Prior to the start of the burst read operation thus designated, the memory bank and the word line have already been selected in the row address strobe/bank active command cycle. The memory cells corresponding to the selected word line are selected and read out successively by the address signal output by the column address counter 207. The number of data units to be read consecutively is the number designated by the burst length above. The data read operation from the output buffer 211 is started upon elapse of the number of cycles of the clock signal CLK designated by the above-mentioned CAS latency.

(4) Column address write command (Wr)

The column address write command is needed to start a burst write operation where burst write is set in the mode register 30. Where signal write is set in the mode register 30 as the desired type of write operation, the column address write command is needed to start the single write operation. This command is also used to designate a column address strobe setting in the single write or burst write operation. The column address write command is designated when the signals /CS, /CAS and /WE are driven Low and the signal /RAS is High. When designated in this manner, the command causes the address fed to the terminals A0 through A7 to be admitted as the column address signal. In the burst write operation, the column address signal thus received is supplied as a burst start address to the column address counter. The burst write operation is carried out in a manner similar to that in which the burst read operation is performed. The difference between the two kinds of operation is that the write operation has no need for CAS latency; the write data starts to be received from the current column address write command cycle on.

(5) Pre-charge command (Pr)

The pre-charge command is used to start a pre-charge operation on the memory bank selected by the inputs from the terminals A8 and A9. This command is designated when the signals /CS, /RAS and /WE are driven Low and the signal /CAS is High.

(6) Auto refresh command

The auto refresh command is needed to start an auto refresh operation. This command is designated when the signals /CS, /RAS and /CAS are brought Low and the signals /WE and CKE are High.

(7) Burst stop in full page command

The burst stop in full page command is needed to stop a full page burst operation on all memory banks, and is ignored in any other burst operations than the full page burst operation. This command is designated when the signals /CS and /WE are driven Low and the signals /RAS and /CAS are High.

(8) No operation command (Nop)

The no operation command is used to specify that no operation is to be performed. This command is designated when the signals /CS is driven Low and the signals /RAS, /CAS and /WE are High.

(9) Data operation command

The data operation command is used to set the operation mode for the operation circuit 9 and to designate a switchover of the multiplexers 8B, 9C and 10A. For example, the available mode of operation for the operation circuit 9 includes OR, AND and exclusive-OR. The selected mode of operation for the operation circuit 9 is combined with the data selected by the multiplexer 9C to be operated on. This designates the externally entered data and the data read from the memory bank 0 or 1. When the multiplexers 8B and 10A are suitably designated in write mode, the target data is operated on and the result of the operation is written to the memory bank 0 or 1 while being output concurrently. In read operation, the data read from the memory bank 0 or 1 and the input data are operated on, and the result of the operation is output. Alternatively, one memory bank may be set to undergo a read operation while the other memory bank is subjected to a write operation.

The above-described data operation command is designated by a suitable combination of the signals /CS, /RAS, /CAS, /WE and CKE, the combination being other than those for designating the commands (1) through (8) above. The address fed to the terminals A0 through A7 is utilized in generating various control signals.

With the SDRAM, while one memory bank is undergoing a burst operation, the other memory bank may be designated to be supplied with the row address strobe/bank active command. In that case, the other memory bank is made available for a row address-related operation while the memory bank subject to the burst operation is left unaffected. Illustratively, the SDRAM has means for retaining externally supplied data, addresses and control signals. The retained contents, particularly the addresses and control signals, are retained for, but not limited to, the respective memory banks. Alternatively, a latch circuit, not shown, is used to latch the data from one word line of the memory block selected by the row address strobe/bank active command; the data from the memory is thus latched in preparation for a column address-related operation.

Therefore, as far as no data collision occurs at the data input/output terminal I/O, the following is possible: with one memory bank currently undergoing command execution, the other memory bank may be issued a pre-charge command and a row address strobe/bank active command to start an internal operation in advance.

Because the SDRAM setup is capable of admitting and outputting data, addresses and control signals in synchronism with the clock signal CLK, an SDRAM as large as DRAMs in capacity may be operated as fast as SRAMs. Since one selected word line is matched with the setting of a burst length designating the number of data units to be accessed, the built-in column address counter may successively change column addresses so as to read or write a plurality of data units continuously. Working in this manner, the SDRAM together with its operation circuit serves as a viable image memory without the use of a serial input/output circuit.

Figure 4:
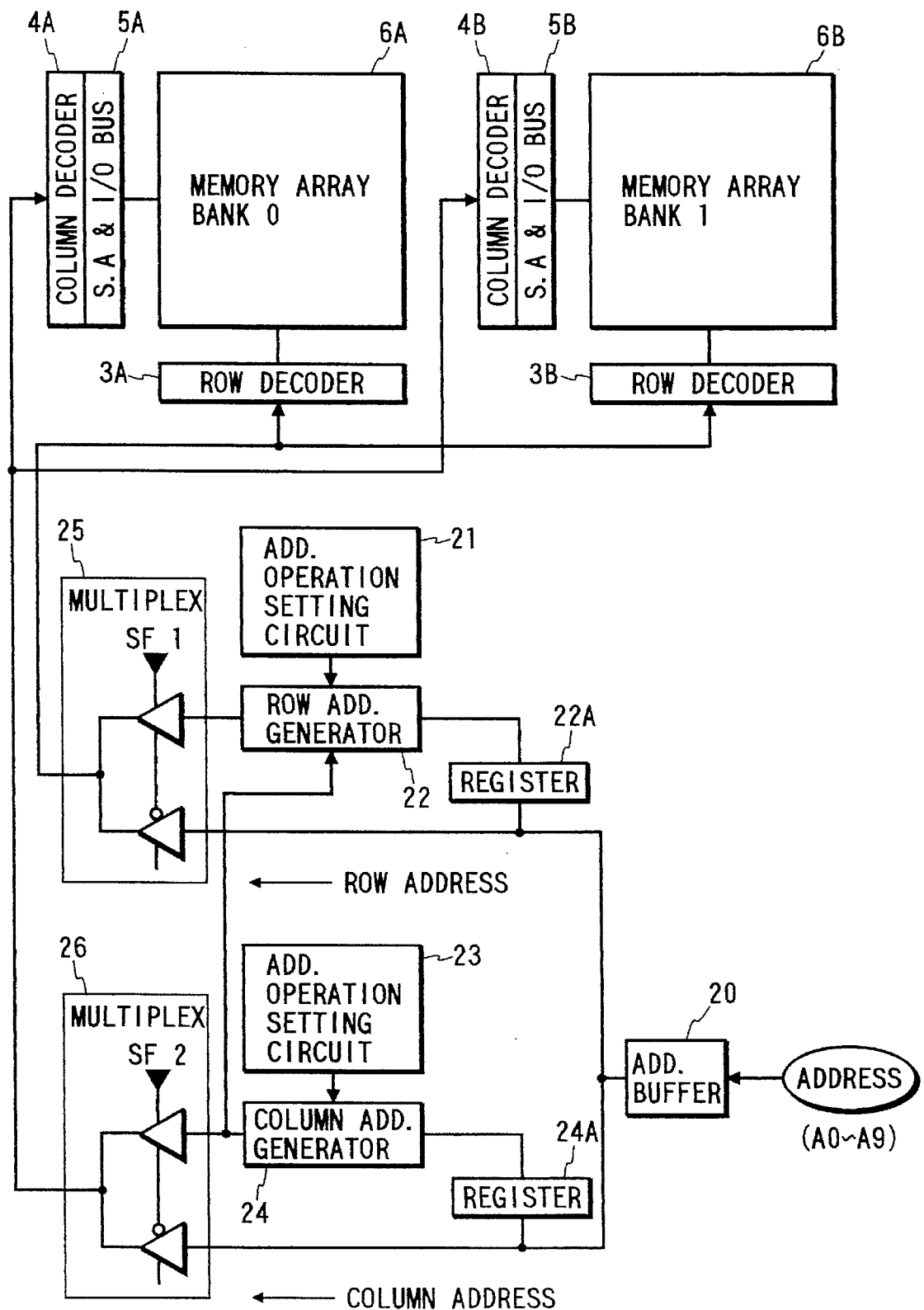
FIG. 4 is a block diagram of an SDRAM practiced as a third embodiment of the invention.

FIG. 4 is a block diagram of an SDRAM practiced as the third embodiment of the invention. This embodiment includes an address operation circuit in addition to the data operation circuit described above.

A column address generator 24 in FIG. 4 has its input portion furnished with a register 24A to retain an initial address. Starting from the initial address, the column address generator 24 counts addresses for the burst access operation discussed earlier. Furthermore, the column address generator 24 performs access operations using "skipping" addresses obtained through increments or decrements of N by an operation setting circuit 23. A multiplexer 26 designates the column address by selecting one of two address signals: one received from an address buffer 20, the other generated by the column address generator 24.

The third embodiment includes similar circuits on the row address side. A row address generator 22 has its input portion furnished with a register 22A to retain an initial address. Starting from that initial address, the row address generator 22 performs access operations using "stepping" addresses obtained through increments or decrements of 1 or "skipping" addresses acquired through increments or decrements of N by an operation setting circuit 21. A multiplexer 25 designates the row address by selecting one of two address signals: one received from the address buffer 20, the other generated by the row address generator 22. Except for the component parts associated with the data operation circuit, the third embodiment is the same in constitution as the second embodiment in FIG. 3.

Where the above-described address operation function is provided, it is possible to admit one address from the outside while having internal circuits gain access to a different address concurrently. This means that, in an example where the same figure is to be written to different addresses, the same data need only be input to the same address. In another example, data (e.g., a figure) is read from the memory bank 0 and written to the memory bank 1 by simply carrying out the above-described address operation and switching the multiplexers 25 and 26. In this manner, arithmetic operations on address signals readily permit the movement of figures and the drawing of graphic forms and patterns such as repeat patterns.

Figure 5A:
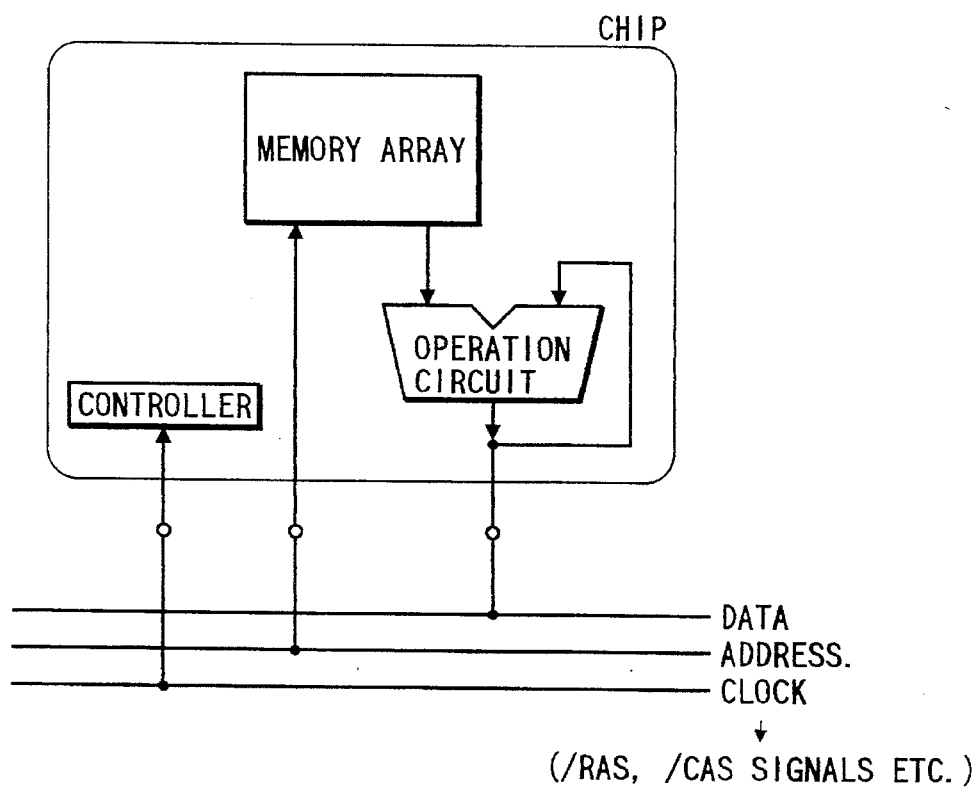
FIGS. 5A and 5B are views showing how the first embodiment of FIG. 1 operates.
Figure 5B:
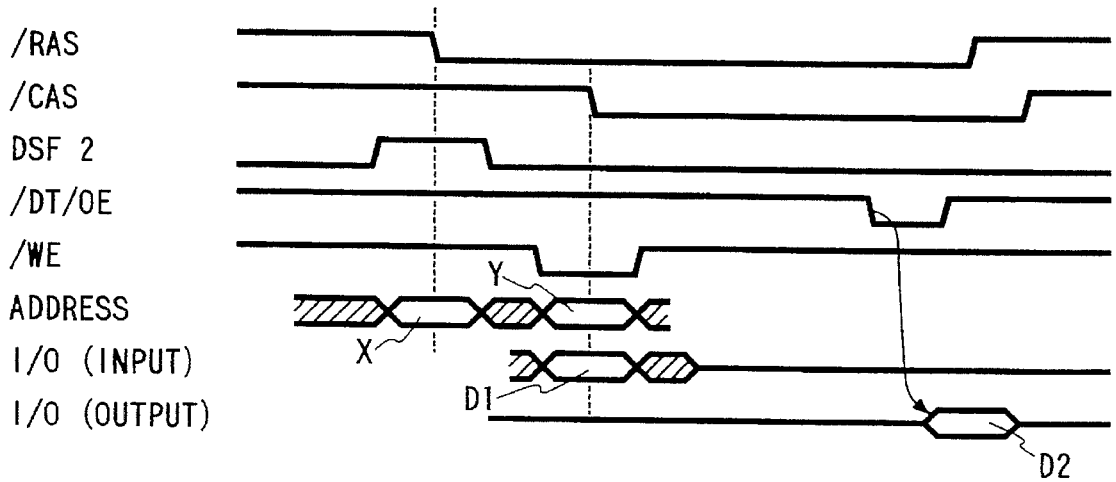

FIGS. 5A and 5B are views showing how the first embodiment of FIG. 1 operates. FIG. 5A is a circuit block diagram of the signal transmission paths in the first embodiment. FIG. 5B is a signal waveform chart illustrating typical waveforms of the signals used by the first embodiment. In synchronism with a trailing edge of the signal /RAS, the row address signal X is admitted and the operation mode is selected by the signal DSF2.

In synchronism with a trailing edge of the signal /CAS, the column address signal Y is admitted and data is read from the memory array. When the signal /WE is brought Low, the operation data D1 fed via the external terminal is admitted. The result of the operation, D2, is output to the outside when the signal /OE is driven Low. In this manner, data is read from the memory and the result of the operation is output concurrently in a single memory cycle.

Figure 6A:
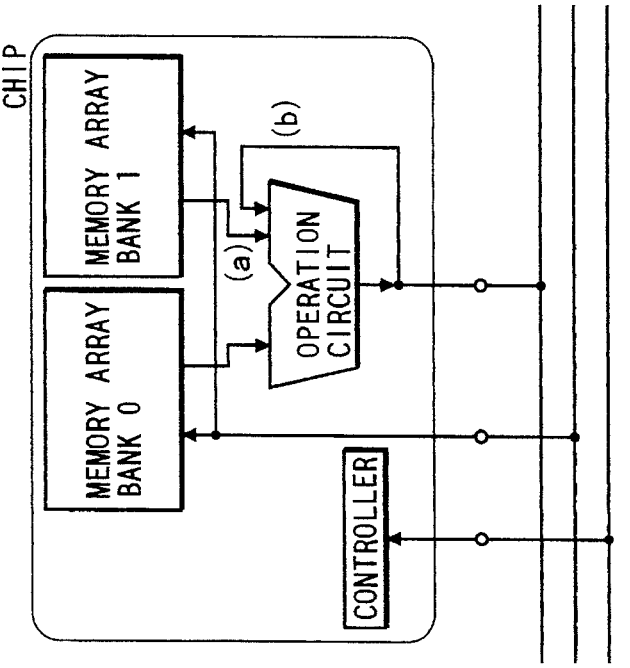
FIGS. 6A and 6B are views depicting how the second embodiment of FIG. 3 operates.
Figure 6B:
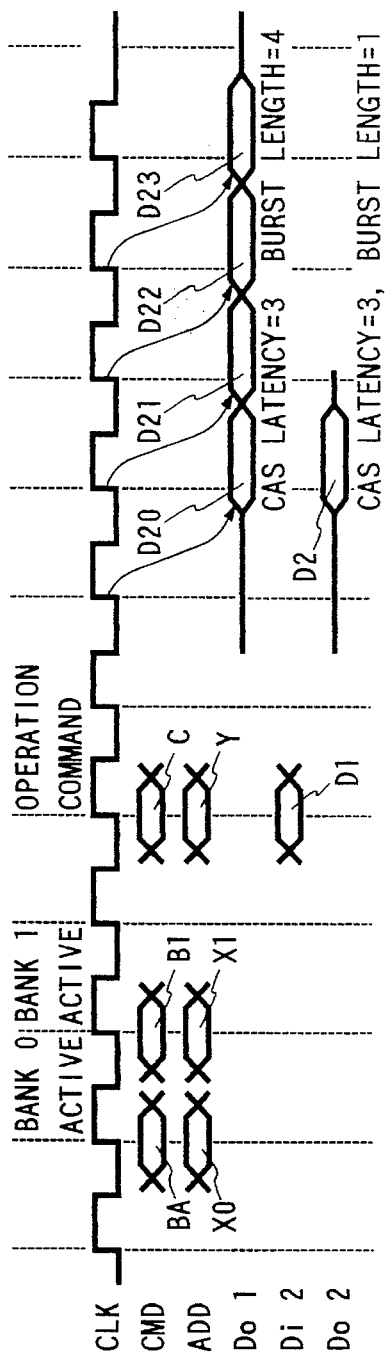

FIGS. 6A and 6B are views depicting how the second embodiment of FIG. 3 operates. FIG. 6A is a circuit block diagram of the signal transmission paths in the second embodiment. FIG. 6B is a signal waveform chart illustrating typical waveforms of the signals used by the second embodiment.

The active command BA for the memory bank 0 is input, and the row address signal X0 is made active. Then the active command B1 for the memory bank 1 is input, and the row address signal X1 is made active.

In case (a) shown in FIG. 6A, the operation command C is input and the column address signal Y is admitted. As indicated by the signal paths of case (a) in FIG. 6A, data is read from both the memory bank 0 and the memory bank 1 for entry into the operation circuit (burst operation). If the CAS latency is set illustratively for 3 and the burst length for 4, the result of the operation is output from the external terminal in the form of output signals D20, D21, D22 and D23, in that order (burst output). In case (a), the external terminal is represented by Do1.

In case (b) shown in FIG. 6A, the operation command C is input and the column address signal Y is admitted to read data from the memory bank 0. At the same time, the operation data D1 is admitted through the external terminal. As indicated by the signal paths of case (b) in FIG. 6A, the data from the memory bank 0 and the input data D1 are entered into the operation circuit. If the CAS latency is set illustratively for 3 and the burst length for 1, the result of the operation is output upon elapse of the designated latency period via the external terminal in the form of one signal D. In case (b), the external terminal is represented by Di2 and Do2. Case (a) or (b) above is selected illustratively by bringing the signal /WE High or Low.

Figure 7A:
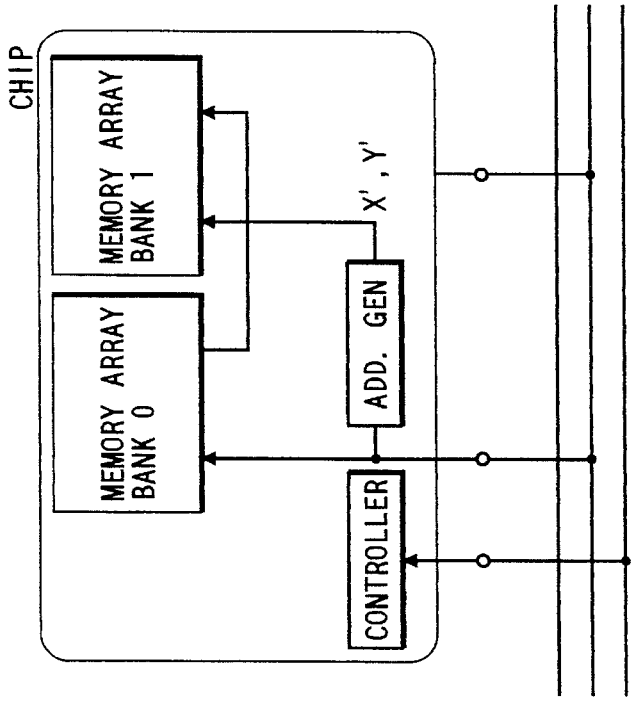
FIGS. 7A and 7B are views illustrating how the third embodiment of FIG. 4 operates.
Figure 7B:
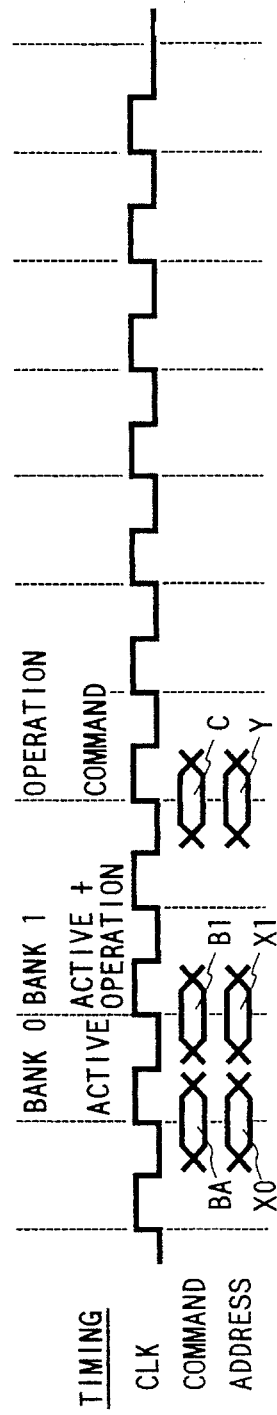

FIGS. 7A and 7B are views illustrating how the third embodiment of FIG. 4 operates. FIG. 7A is a circuit block diagram of the signal transmission paths in the third embodiment. FIG. 7B is a signal waveform chart illustrating typical waveforms of the signals used by the third embodiment.

The active command BA for the memory bank 0 is input, and the row address signal X0 is made active. The active command and the operation command B1 for the memory bank 1 are input, and the row address signal X1 is admitted to perform an address operation. The result of the operation, address signal X', is made active.

The operation command C is input, and the column address signal Y is admitted to gain access to the memory bank 0. The column address signal Y is operated on to generate an address signal Y' whereby the memory bank 1 is accessed. The data read from the memory bank 0 is written to the memory bank 1 (burst operation).

Figure 8A:
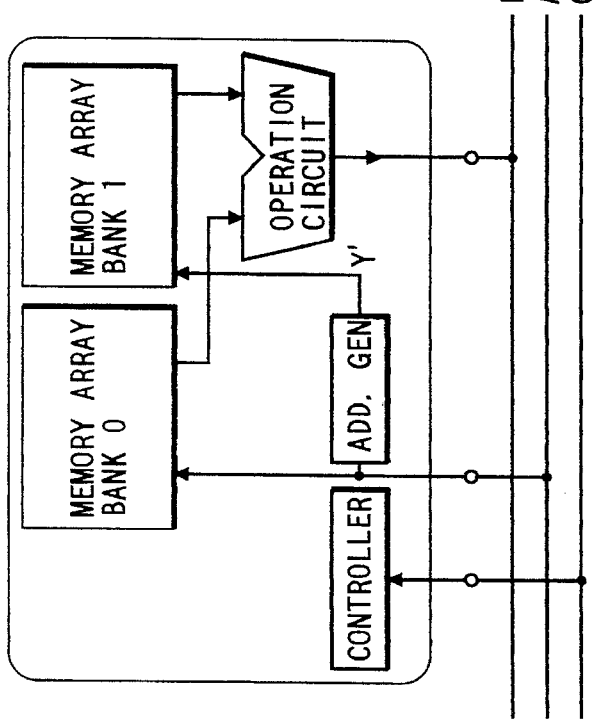
FIGS. 8A and 8B are views indicating how a variation of the invention operates, the variation comprising the data operation circuit of the second embodiment and the address operation circuit of the third embodiment.
Figure 8B:
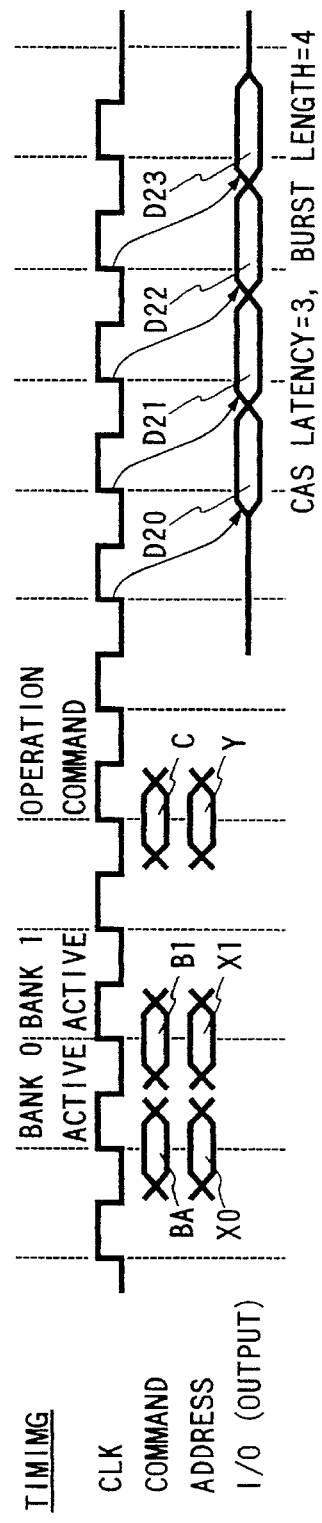

FIGS. 8A and 8B are views indicating how a variation of the invention operates, the variation comprising the data operation circuit of the second embodiment in FIG. 3 and the address operation circuit of the third embodiment in FIG. 4. FIG. 8A is a circuit block diagram of the signal transmission paths in this variation. FIG. 8B is a signal waveform chart illustrating typical waveforms of the signals used by this variation.

The active command BA for the memory bank 0 is input, and the low address signal X0 is made active. The active command B1 for the memory bank 1 is input, and the row address signal X1 is made active. Then the operation command C is input, and the column address signal Y is admitted to gain access to the memory bank 0. The address signal Y is operated on to generate an address signal Y' whereby the memory bank 1 is accessed.

Data is read from both the memory bank 0 and the memory bank 1 for entry into the operation circuit (burst operation). As with the second embodiment, the CAS latency is set illustratively for 3 and the burst length for 4. The result of the operation is then output from the external terminal in the form of output signals D20, D21, D22 and D23, in that order (burst output). In a similar fashion, the row address signal may also be operated on.

Figure 9:
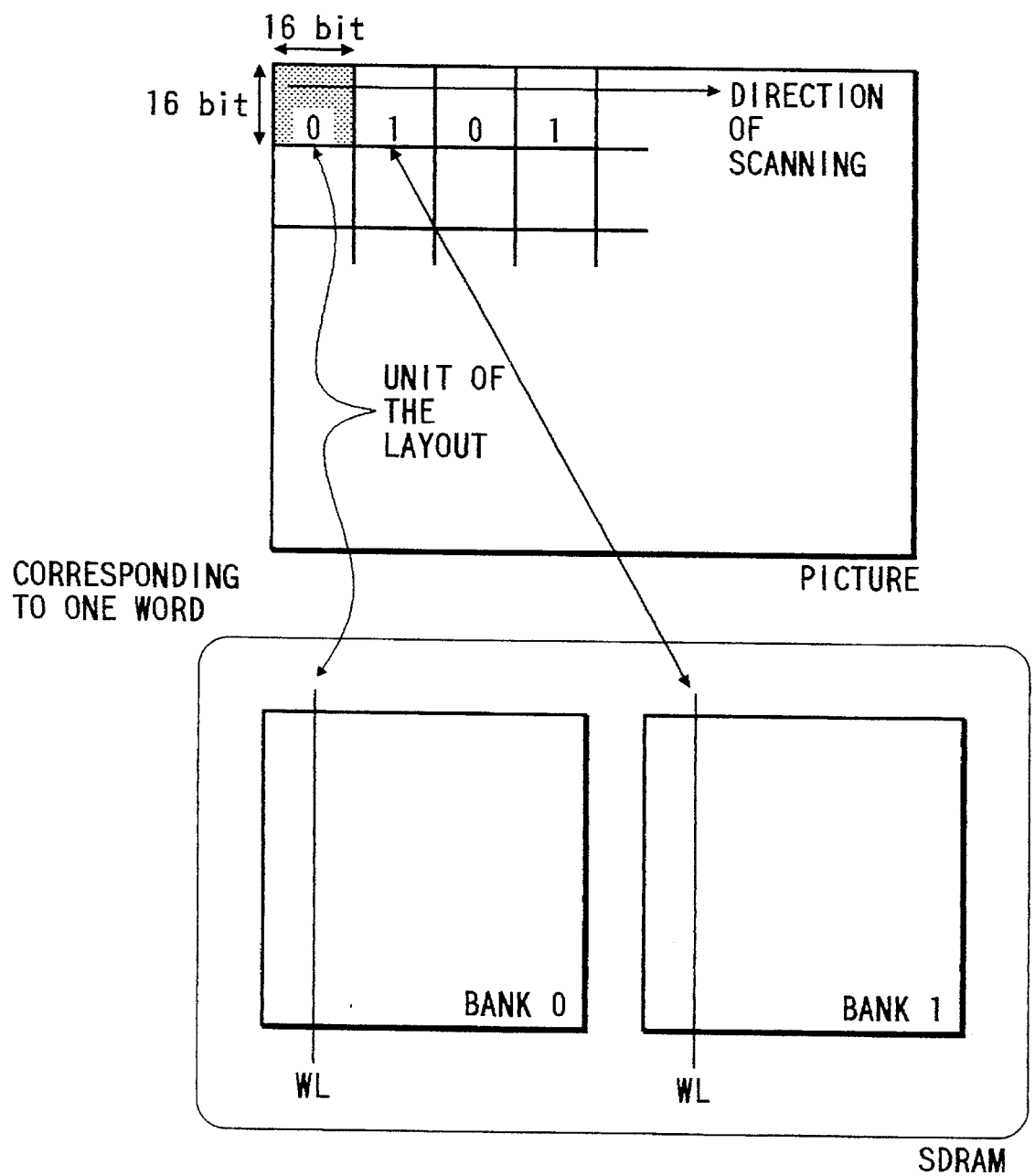
FIG. 9 is a schematic view showing an example of the picture layout for the SDRAM representing the third or the fourth embodiment.

FIG. 9 is a schematic view showing an example of the picture layout for the SDRAM representing the third or the fourth embodiment, the memory serving as an image memory (i.e., frame memory). Illustratively, the SDRAM is set for access in units of 16 bits so as to assign data alternately in the memory banks 0 and 1 in units of 16 bits in the scanning direction of the picture. In this arrangement, if any one word line is assigned an insufficient number of memory cells in the scanning direction, the memory bank 0 (or 1) on the one hand is subjected to a read operation while word lines are switched for the other memory bank 1 (or 0). This permits continuous reading of data in the same scanning direction with the same timing.

It follows that when the number of pixel data is increased through the enlargement of the picture screen and/or its enhancement in resolution, the memory banks 0 and 1 are accessed alternately and the word line switchover time is practically eliminated. This makes it possible to read image data in synchronism with the raster scan timing of the display unit such as a CRT.

Figure 10:
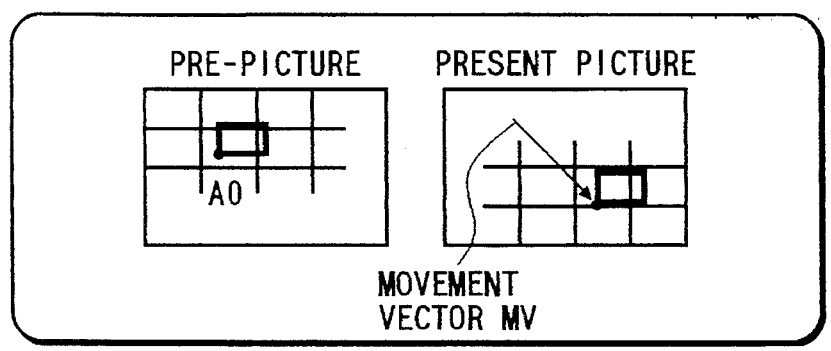
FIG. 10 is a view of display pictures depicting how an image is compressed and displayed according to the invention.

FIG. 10 is a view of display pictures depicting how an image is compressed and displayed according to the invention. FIG. 10 includes a preceding picture and a present picture showing how the data in the preceding picture is moved from location A0 by a vector MV to the present picture.

Figure 11:
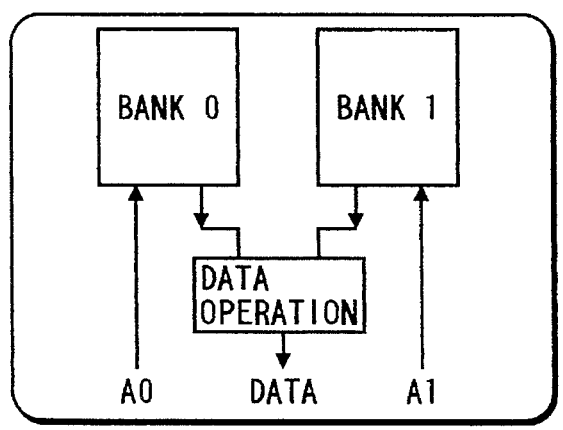
FIG. 11 is a schematic block diagram indicating how the data movement in FIG. 10 is detected according to the invention.

FIG. 11 is a schematic block diagram indicating how the data movement in FIG. 10 is detected according to the invention. The data A0 in the preceding picture is first compared with the data in the present picture. Of the data compared between the two pictures, those data units that coincide or closely match with one another are found and their movement vector is detected. What is detected in FIG. 10 is the process of the data having been moved from location A0 by the vector MV. In this example, the preceding and the present picture are arranged to correspond with the memory banks 0 and 1 respectively. Data is read from both the bank 0 and the bank 1 for a compare operation. The result of the comparison is output to the outside. The host computer such as the CPU receives the result of the operation and determines the movement vector MV therefrom.

Figure 12:
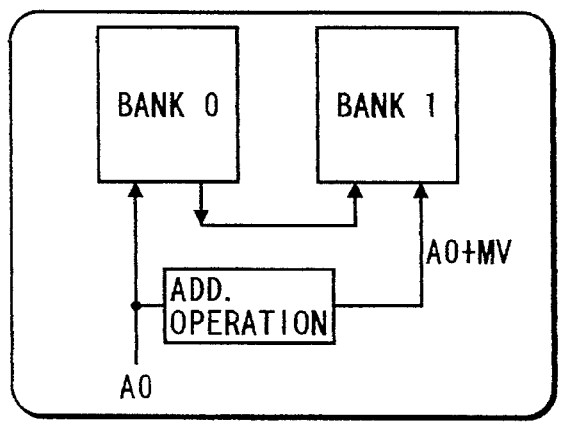
FIG. 12 is a schematic block diagram illustrating how the picture data of FIG. 10 is generated according to the invention.

FIG. 12 is a schematic block diagram illustrating how the picture data of FIG. 10 is generated according to the invention. In response to the data of the preceding picture, the moved data and the vector MV of the movement are provided. Only the relevant portion of the data is updated in order to generate the post-movement data for display on the present picture. The figures represented by the data are shown illustratively in a multi-window setup. With this embodiment, the preceding and the present picture are arranged to correspond with the memory banks 0 and 1 respectively. Data is read from the designated address in the memory bank 0. At the same time, an address operation is carried out to generate the address of the memory bank 1. The data read from the memory bank 0 is written to the address thus acquired in the memory bank 1. The host computer such as the CPU transfers the present picture data to the display buffer memory (i.e., frame memory) so as to update the display data.

Figure 13:
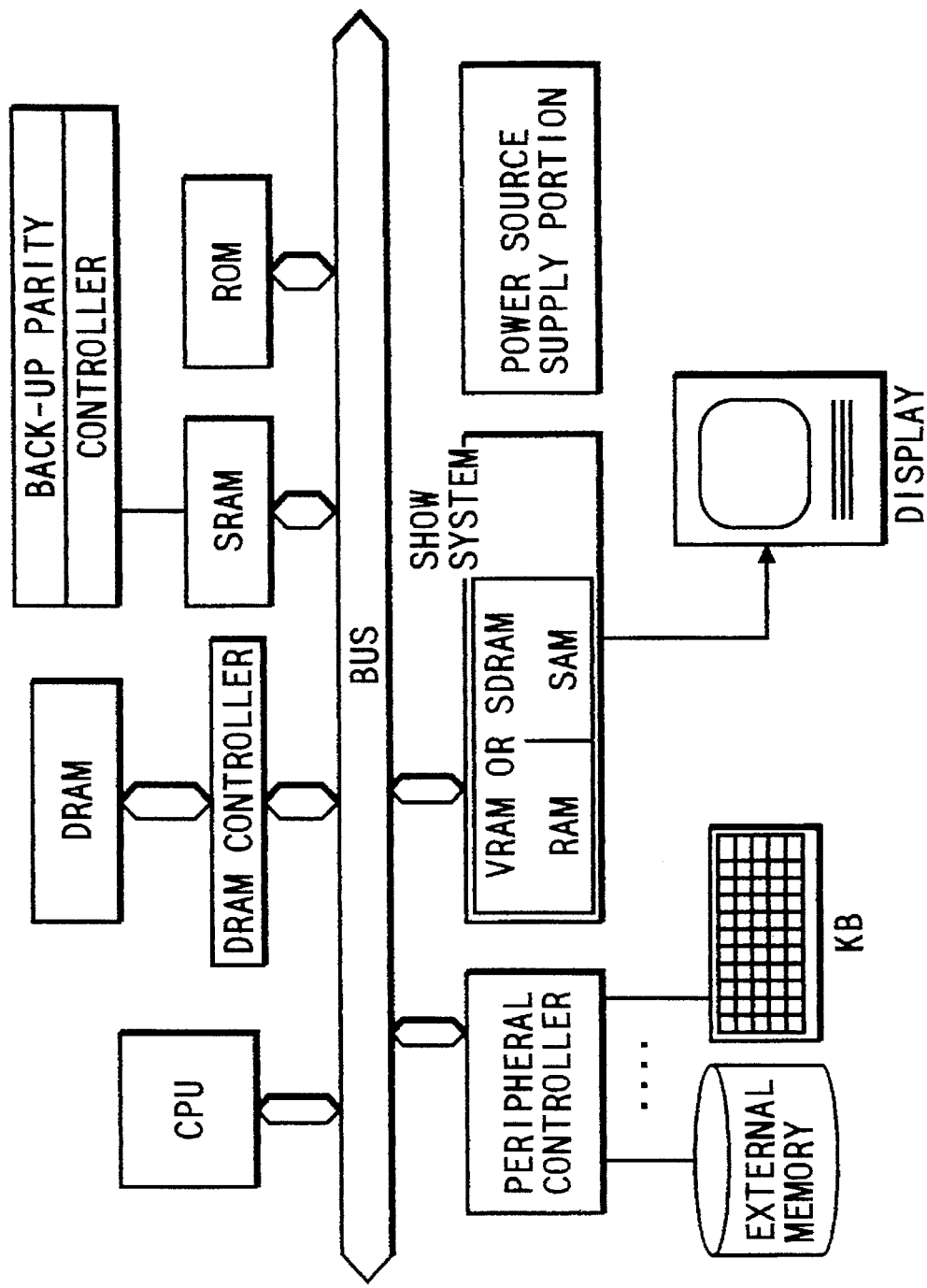
FIG. 13 is a function block diagram of a typical computer system comprising an image memory (VRAM) to which the invention is applied.

FIG. 13 is a function block diagram of a typical computer system including an image memory (VRAM or SDRAM) to which the invention is applied. The computer system comprises a bus, a central processing unit (CPU), a peripheral controller, a DRAM (dynamic memory) serving as a main memory together with its controller, a back-up SRAM (static memory), a back-up parity bit memory and its controller, a ROM (read only memory) for storing programs, and a display unit.

The peripheral controller is connected to an external memory device and a keyboard KB. The display unit includes a VRAM such as the semiconductor memory shown in FIG. 1 or 4. When connected to the display unit working as an output device, the VRAM serves to display stored information. A power source supply portion is provided to power the internal circuits of the computer system. The CPU generates signals for controlling the operation timing of each of the memories configured as described above.

As described, the inventive semiconductor memory incorporates the operation circuit for carrying out simple image processing at high speed, in addition to the frame memory that simply retains display data. As such, the semiconductor memory in the system works as a coprocessor for processing image data in cooperation with the CPU. That is, the semiconductor memory takes over from the CPU the functions of logical operations on image data and address operations thereby rapidly generating display data. The function of outputting the result of the operation in a single memory cycle is indispensable in boosting the speed of data processing by the host computer such as the CPU. The typical conventional image memory needs two different memory cycles for data operation and output: a data operation is carried out in the first cycle, and the result of the operation is output in the second cycle. Because it takes two memory access cycles to deal with each data handling process, the conventional setup is not expected to enhance the data processing speed.

The major benefits of the invention, as they have been noted from the above-described embodiments, are as follows:

(1) The built-in operation circuit in the inventive semiconductor memory carries out logical operations on data and arithmetic operations on address signals. The data reflecting the result of any of such operations is written to the memory array and is output through the external terminal in the same memory cycle. This feature allows various kinds of data processing to be performed at high speed.

(2) The inventive synchronous dynamic RAM having a first and a second memory bank each accessible independently comprises an operation circuit that performs logical operations selectively on one of two kinds of data: on externally entered data from the external terminal, and on the data read from the first or the second memory bank. The result of any of such operations is output via the external terminal in the same memory cycle or written to the first or the second memory bank. This also allows various kinds of data processing to be carried out at high speed.

(3) The inventive semiconductor memory is provided with a memory circuit for storing an input address signal, an operation circuit for performing arithmetic operations on the data retrieved from the memory circuit and on the input address signal, an address selection circuit for gaining access to the memory by selectively utilizing the result of the operation or the input address signal, and a data read/write circuit for writing and reading data to and from the memory cells selected by the address selection circuit. These circuits combine to carry out sophisticated data processing such as figure movement at high speed.

(4) The inventive synchronous dynamic RAM having a first and a second memory bank each accessible independently comprises a memory circuit for storing an input address signal, an operation circuit for performing arithmetic operations on the data retrieved from the memory circuit and on the input address signal, an address selection circuit for gaining access to the first or the second memory bank by selectively utilizing the result of the operation or the input address signal, and a data read/write circuit for writing and reading data to and from the memory bank selected by the address selection circuit. These circuits also combine to allow sophisticated data processing such as figure movement to be effected at high speed.

Although the description above contains many specificities, these should not be construed as limiting the scope of the invention but as merely providing illustrations of the presently preferred embodiments of this invention. For example, the SDRAM may be furnished with a serial output circuit. Such an SDRAM will constitute a semiconductor memory having the functions of both a coprocessor and a frame memory for image processing. This kind of memory structurally simplifies the system of which it is a part and allows the system to run at high speed. The operation circuit and the signal transmission paths associated with it may take diverse forms when implemented.

This invention may be applied as a semiconductor memory for storing image data in a wide range of applications.

The major advantages of this invention are summarized as follows: the internal operation circuit carries out logical operations on data and arithmetic operations on address signals. The data representing the result of the operation is written to the memory array and is output through the external terminal in the same memory cycle. This allows various kinds of data processing to be performed rapidly.

The inventive synchronous dynamic RAM having a first and a second memory bank each accessible independently includes an operation circuit for performing logical operations selectively either on externally entered data from the external terminal or on the data read from the first or the second memory bank. The result of the operation is output via the external terminal in the same memory cycle or written to the first or the second memory bank. This also allows various kinds of data processing to be carried out rapidly.

The inventive memory has a memory circuit for storing an input address signal, an operation circuit for performing arithmetic operations on the data from the memory circuit and on the input address signal, an address selection circuit for accessing the memory as per the result of the operation or the input address signal, and a data read/write circuit for writing and reading data to and from the memory cells selected by the address selection circuit. The circuitry rapidly performs sophisticated data processing such as figure movement.

The inventive synchronous dynamic RAM having a first and a second memory bank each accessible independently includes a memory circuit for storing an input address signal, an operation circuit for performing arithmetic operations on the data from the memory circuit and on the input address signal, an address selection circuit for accessing the first or the second memory bank as per the result of the operation or the input address signal, and a data read/write circuit for writing and reading data to and from the memory bank selected by the address selection circuit. This circuitry also allows sophisticated data processing such as figure movement to be carried out rapidly.

We claim:

1. A semiconductor memory comprising:

a memory portion having a plurality of memory cells furnished at the points of intersection between a plurality of word lines and a plurality of data lines;

an operation circuit having a plurality of operation modes and operating in accordance with a designated operation mode;

a first external terminal;

a first output circuit furnished interposingly between the output terminal of said operation circuit and said first external terminal, said first output circuit feeding the output data of said operation circuit to said first external terminal;

a second output circuit furnished interposingly between said output terminal of said operation circuit and said memory portion, said second output circuit feeding the output data of said operation circuit as write data to said memory portion;

a first input circuit for providing a first input terminal of said operation circuit with first data supplied from outside said semiconductor memory; and a second input circuit furnished interposingly between a second input terminal of said operation circuit and said memory portion, said second input circuit providing said second input terminal with second data retrieved from said memory portion;

wherein said operation circuit receives and operates on said first and said second data in accordance with said designated operation mode; and wherein the output data of said operation circuit is given to said first external terminal in the operation cycle in which the same output data is written to said memory portion.

2. A semiconductor memory according to claim 1, further comprising:

a second external terminal for receiving a row address strobe signal /RAS;

a third external terminal for receiving a column address strobe signal /CAS;

a fourth external terminal for receiving a write enable signal /WE;

a fifth external terminal for receiving a chip select signal /CS; and a control circuit connected to said second external terminal, said third external terminal, said fourth external terminal and said fifth external terminal, respectively, said control circuit outputting control signals upon detecting the levels of said row address strobe signal, said column address strobe signal, said write enable signal and said chip select signal received by said second, third, fourth and fifth external terminals, respectively;

wherein the operation mode of said operation circuit is designated on the basis of said control signals.

3. A semiconductor memory according to claim 2, further comprising:

a first switch circuit for selectively supplying said second output circuit with one of said output data of said operation circuit and said first data;

a second switch circuit for selectively supplying said first output circuit with one of said output data of said operation circuit and said second data; and an external address terminal;

wherein said first and said second switch circuit are controlled in accordance with the signal fed to said external address terminal.

4. A semiconductor memory according to claim 3, further comprising:

a sixth external terminal; and a serial output circuit connected to said memory portion so as to store a parallel signal output from said memory portion and to output serially said parallel signal to said sixth external terminal.

5. A semiconductor memory according to claim 4, wherein said first data is obtained from said first external terminal.

6. A semiconductor memory according to claim 5, wherein said plurality of memory cells are dynamic memory cells.

7. A semiconductor memory according to claim 2, wherein the operation of said operation circuit is carried out, said output data of said operation circuit is written to said memory portion, and said output data of said operation circuit is fed to said first external terminal while said row address strobe signal /RAS is being driven Low continuously.

8. A semiconductor memory comprising:

a first and a second memory array each having a plurality of memory cells furnished at the points of intersection between a plurality of word lines and a plurality of data lines;

a first selection circuit for selecting memory cells of said first memory array;

a second selection circuit for selecting memory cells of said second memory array;

an operation circuit having a plurality of operation modes and operating in accordance with a designated operation mode;

a first external terminal;

a first output circuit furnished interposingly between the output terminal of said operation circuit and said first external terminal, said first output circuit feeding the output data of said operation circuit to said first external terminal;

a second output circuit furnished interposingly between said output terminal of said operation circuit and said first memory array, said second output circuit feeding said output data of said operation circuit to said first memory array as write data;

a third output circuit furnished interposingly between said output terminal of said operation circuit and said second memory array, said third output circuit feeding said output data of said operation circuit to said second memory array as write data;

a first input circuit for providing a first input terminal of said operation circuit with first data supplied from outside said semiconductor memory; and a second input circuit for providing a second input terminal of said operation circuit with second data retrieved either from said first memory array or from said second memory array;

wherein said operation circuit receives and operates on said first and said second data in accordance with said designated operation mode; and wherein the output data of said operation circuit is given to said first external terminal in the operation cycle in which the same output data is written to memory cells either of said first memory array or of said second memory array.

9. A semiconductor memory according to claim 8, further comprising:

a second external terminal for receiving a row address strobe signal /RAS;

a third external terminal for receiving a column address strobe signal /CAS;

a fourth external terminal for receiving a write enable signal /WE;

a fifth external terminal for receiving a chip select signal /CS; and a control circuit having a first input connected to said second external terminal, a second input connected to said third external terminal, a third input connected to said fourth external terminal and a fourth input connected to said fifth external terminal, said control circuit outputting control signals upon detecting the levels of said row address strobe signal, said column address strobe signal, said write enable signal and said chip select signal received by said second, third, fourth and fifth external terminals, respectively;

wherein the operation mode of said operation circuit is designated in accordance with the control signals output by said control circuit.

10. A semiconductor memory according to claim 9, wherein the operation of said operation circuit is carried out, said output data of said operation circuit is written either to said first memory array or to said second memory array, and said output data of said operation circuit is fed to said first external terminal while said row address strobe signal /RAS is being driven Low continuously.

11. A semiconductor memory comprising:

a memory portion having a plurality of memory cells furnished at the points of intersection between a plurality of word lines and a plurality of data lines;

an operation circuit having a plurality of operation modes and operating in accordance with a designated operation mode;

a selection circuit furnished interposingly between the output terminal of said operation circuit and said memory portion, said selection circuit selecting memory cells in said memory portion in accordance with the address signal output by said operation circuit;

a first input circuit for providing a first input terminal of said operation circuit with a first address signal supplied from outside said semiconductor memory; and a second input circuit furnished interposingly between a second input terminal of said operation circuit and said memory portion, said second input circuit providing said second input terminal with a second address signal retrieved from said memory portion;

wherein said operation circuit receives and operates on said first and said second address signal in accordance with said designated operation mode.

12. A semiconductor memory according to claim 11, further comprising:

a first external terminal for receiving a row address strobe signal /RAS;

a second external terminal for receiving a column address strobe signal /CAS;

a third external terminal for receiving a write enable signal /WE;

a fourth external terminal for receiving a chip select signal /CS; and a control circuit having a first input connected to said second external terminal, a second input connected to said third external terminal, a third input connected to said fourth external terminal and a fourth input connected to said fifth external terminal, said control circuit outputting control signals upon detecting the levels of said row address strobe signal, said column address strobe signal, said write enable signal and said chip select signal received by said second, third, fourth and fifth external terminals, respectively;

wherein the operation mode of said operation circuit is designated on the basis of said control signals.

\* \* \* \* \*